(12) United States Patent
Mandal

(10) Patent No.: US 9,425,811 B1
(45) Date of Patent: Aug. 23, 2016

(54) METHOD AND APPARATUS FOR COMPENSATING OFFSET DRIFT WITH TEMPERATURE

(71) Applicant: Texas Instruments Incorporated, Dallas, TX (US)

(72) Inventor: Dipankar Mandal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/871,005

(22) Filed: Sep. 30, 2015

Related U.S. Application Data

(60) Provisional application No. 62/149,971, filed on Apr. 20, 2015.

(51) Int. Cl.
*H03M 1/06* (2006.01)
*H03M 1/12* (2006.01)
*H03M 1/44* (2006.01)

(52) U.S. Cl.
CPC .......... *H03M 1/0607* (2013.01); *H03M 1/1245* (2013.01); *H03M 1/442* (2013.01)

(58) Field of Classification Search
CPC ............................. H03M 1/002; H03M 1/607
USPC .................. 341/143, 155, 144, 119, 118, 120
See application file for complete search history.

(56) References Cited

U.S. PATENT DOCUMENTS

| | | | |
|---|---|---|---|
| 6,847,319 B1 * | 1/2005 | Stockstad | G01K 7/01 341/119 |
| 7,312,648 B2 * | 12/2007 | Yang | G01K 7/01 327/512 |

* cited by examiner

*Primary Examiner* — Peguy Jean Pierre
(74) *Attorney, Agent, or Firm* — John R. Pessetto; Charles A. Brill; Frank D. Cimino

(57) ABSTRACT

The disclosure provides an analog to digital converter (ADC). The ADC includes a comparator that receives a threshold voltage. A set of elementary capacitors is coupled to the comparator, and receives one of an input voltage and a set of reference voltages. A set of M offset capacitors is coupled to the comparator, and receives one of a primary voltage and a secondary voltage, M is an integer. A difference in the primary voltage and the secondary voltage varies linearly with temperature.

20 Claims, 3 Drawing Sheets

METHOD AND APPARATUS FOR COMPENSATING OFFSET DRIFT WITH TEMPERATURE

CROSS REFERENCES TO RELATED APPLICATIONS

This application claims priority from U.S. provisional patent application No. 62/149,971 filed on Apr. 20, 2015 which is hereby incorporated by reference in its entirety.

TECHNICAL FIELD

The present disclosure is generally related to an analog front end (AFE) and more particularly to compensating offset drift with temperature in the AFE.

BACKGROUND

Analog systems and digital systems are commonly implemented in an integrated circuit using system on-chip (SOC) technology. Such systems commonly include an analog front end (AFE) circuit. The AFE circuit operates as an interface between an external input terminal, through which analog signals are input, and a digital signal processing unit that processes the received signals in digital format.

The AFE circuit is widely used in various devices, such as down converters for wireless digital communication devices, digital image scanners, digital cameras and voice codecs, and the like. The AFE circuit includes an amplifier and an analog to digital converter (ADC). The amplifier amplifies the received analog signals, and the ADC converts the amplified analog signals into digital signals. The AFE along with the ADC has an associated offset. This offset drifts with temperature. The existing techniques provide dynamic storing of offset. However, there are inherent shortcomings of these techniques which are now described:
(a) Dynamically storing of offset requires an offset storing phase. If sampling mode of the ADC is used for storing offset, then a comparator in the ADC cannot be powered down during sampling phase. If conversion mode of the ADC is used for storing offset, it slows down the ADC.
(b) All devices in the AFE are required to store their offset individually to avoid saturation. This increases the complexity of the AFE; and/or
(c) Dynamic storing of offset results in storage of noise also. This increases a white noise of the AFE.

SUMMARY

According to an aspect of the disclosure, an analog to digital converter (ADC) is disclosed. The ADC includes a comparator that receives a threshold voltage. A set of elementary capacitors is coupled to the comparator, and receives one of an input voltage and a set of reference voltages. A set of M offset capacitors is coupled to the comparator, and receives one of a primary voltage and a secondary voltage, M is an integer. A difference in the primary voltage and the secondary voltage varies linearly with temperature.

BRIEF DESCRIPTION OF THE VIEWS OF DRAWINGS

Figure 1:
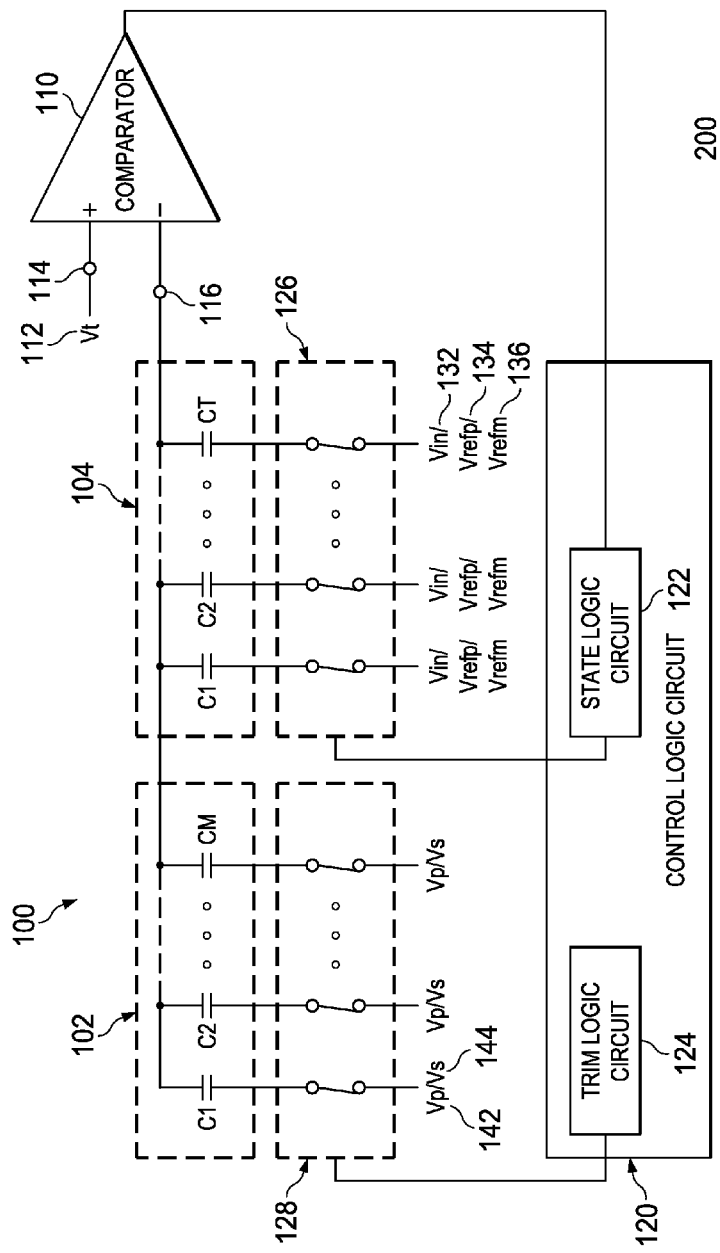
Figure 2:
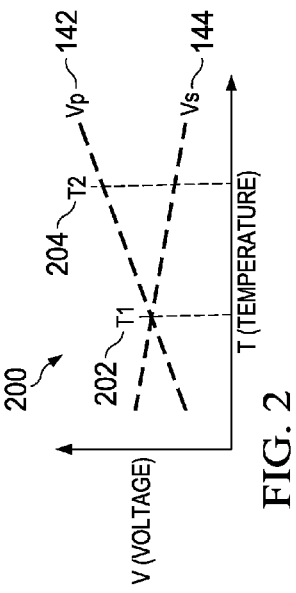
Figure 3:
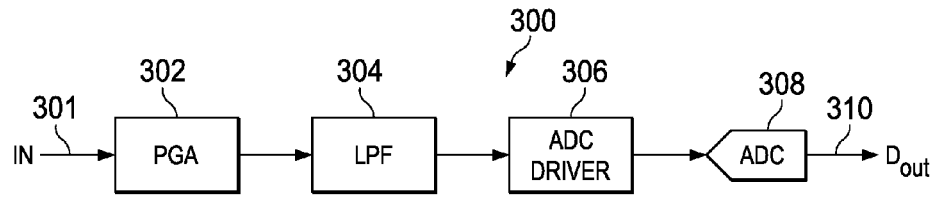
Figure 4:
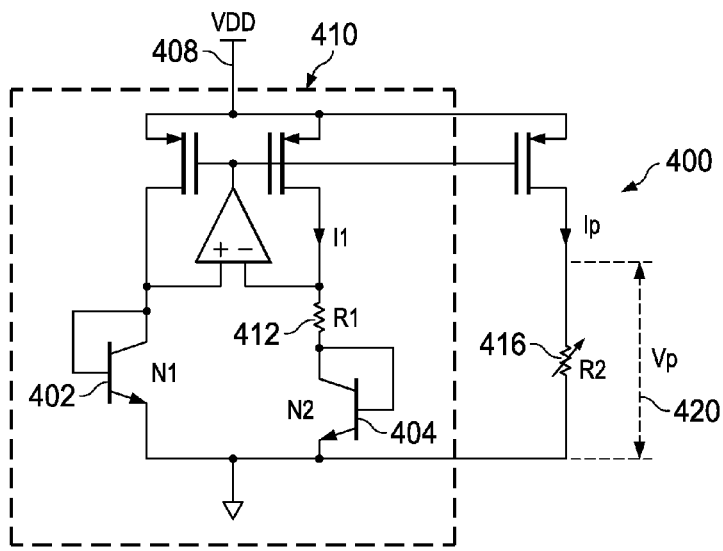
Figure 5:
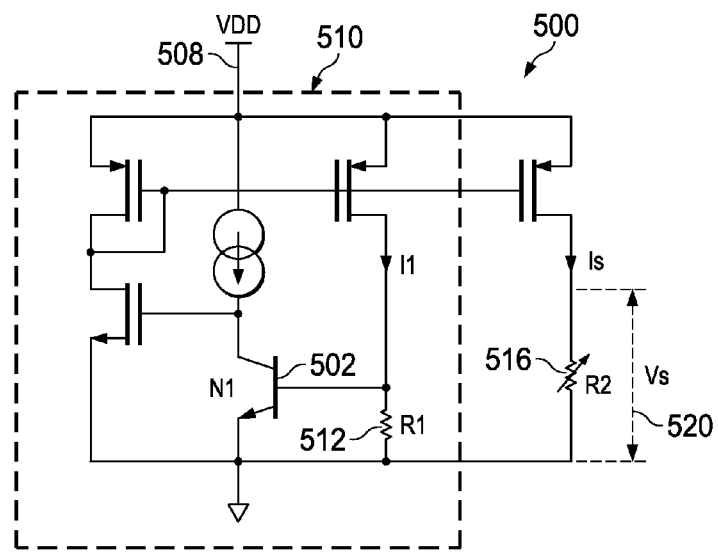
Figure 6:
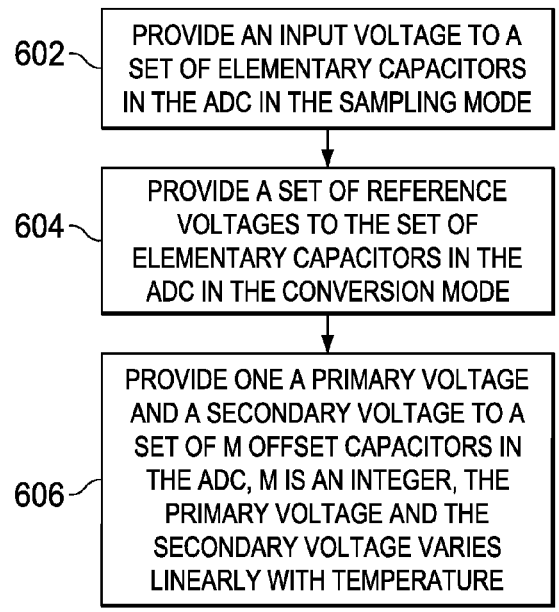
Figure 7:
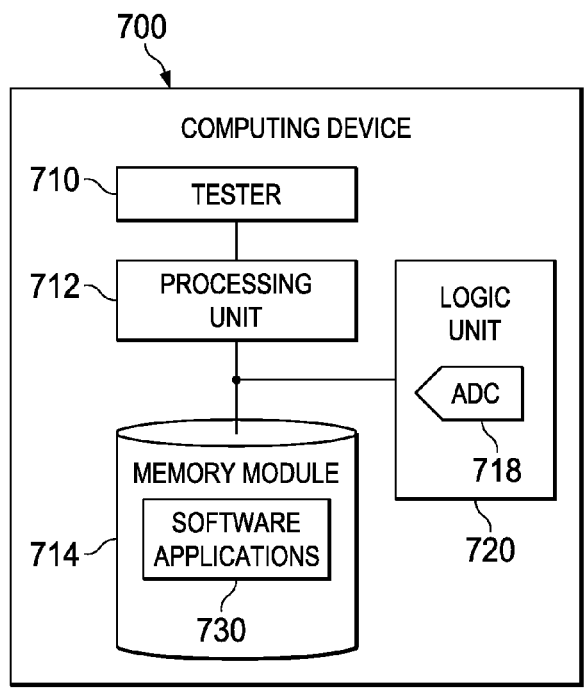

FIG. 1 illustrates an analog to digital converter (ADC), according to an embodiment;
FIG. 2 is a graph to illustrate variation of voltages with temperature, according to an embodiment;
FIG. 3 illustrates an analog front end (AFE), according to an embodiment;
FIG. 4 illustrates a primary voltage generation circuit;
FIG. 5 illustrates a secondary voltage generation circuit;
FIG. 6 is a flowchart illustrating a method of compensating offset drift, according to an embodiment; and
FIG. 7 illustrates a computing device, according to an embodiment.

DETAILED DESCRIPTION OF THE EMBODIMENTS

FIG. 1 illustrates an analog to digital converter (ADC) 100, according to an embodiment. The ADC 100 includes a comparator 110 that receives a threshold voltage Vt 112. The comparator 110 includes a non-inverting terminal 114 and an inverting terminal 116. The comparator 110 receives the threshold voltage Vt 112 at the non-inverting terminal 114. The ADC 100 also includes a set of elementary capacitors 104 represented as C1, C2 to CT. The ADC 100 includes a set of M offset capacitors 102 represented as CO1, CO2 to COM. M is an integer. The set of elementary capacitors 104 and the set of M offset capacitors 102 are coupled to the inverting terminal 116 of the comparator 110.

A control logic circuit 120 is coupled to the comparator 110. The control logic circuit 120 includes a state logic circuit 122 and a trim logic circuit 124. The state logic circuit 122 is coupled to a first set of switches 126. The set of elementary capacitors 104 receives one of an input voltage Vin 132 and a set of reference voltages through the first set of switches 126. The set of reference voltages includes a positive reference voltage Vrefp 134 and a negative reference voltage Vrefm 136.

The trim logic circuit 124 is coupled to a second set of switches 128. The set of M offset capacitors 102 receive a primary voltage Vp 142 and a secondary voltage Vs 144 through the second set of switches 128. The ADC 100 may include one or more additional components known to those skilled in the relevant art and are not discussed here for simplicity of the description.

The operation of the ADC 100 illustrated in FIG. 1 is explained now. A difference in the primary voltage Vp 142 and the secondary voltage Vs 144 varies linearly with temperature. The primary voltage Vp 142 increases linearly with increase in temperature, and the secondary voltage Vs 144 decreases linearly with increase in temperature. In one example, the secondary voltage Vs 144 increases linearly with increase in temperature, and the primary voltage Vp 142 decreases linearly with increase in temperature. The property of linear dependence of the primary voltage Vp 142 and the secondary voltage Vs 144 on temperature is used for compensating offset drift with temperature of ADC 100. In one example, the property is used for compensating offset drift with temperature of an analog front end (AFE) of which ADC 100 is a part.

The ADC 100 operates in a set of trim phases. Each trim phase of the set of trim phases includes a sampling mode and a conversion mode. The set of trim phases includes a first trim phase, a second trim phase, a third trim phase and a fourth trim phase. The first trim phase and the second trim phase occur at a first temperature (T1), and the third trim phase and the fourth trim phase occur at a second temperature (T2). The control logic circuit 120 synchronizes the state logic circuit 122 and the trim logic circuit 124 during the sampling mode and the conversion mode.

In each trim phase of the set of trim phases, the set of elementary capacitors 104 are coupled to the input voltage Vin 132 in the sampling mode. The state logic circuit 122 generates a set of first control signals to activate the first set of switches 126 which couple bottom plates of the set of elementary capacitors 104 to the input voltage Vin 132 in the sampling mode. Also, in each trim phase, the set of elementary capacitors 104 are coupled to one of the positive reference voltage Vrefp 134 and the negative reference voltage Vrefm 136 in the conversion mode. The state logic circuit 122 generates the set of first control signals to activate the first set of switches 126 which couple bottom plates of the set of elementary capacitors 104 to one of the positive reference voltage Vrefp 134 and the negative reference voltage Vrefm 136.

In the first trim phase, the set of M offset capacitors 102 are coupled to the primary voltage Vp 142 both in the sampling mode and in the conversion mode. The ADC 100 generates a first digital code in the first trim phase. The trim logic circuit 124 generates a set of second control signals to activate the second set of switches 128 which couple bottom plates of the set of M offset capacitors 102 to the primary voltage Vp 142 both in the sampling mode and the conversion mode. The first trim phase occurs at the first temperature (T1).

The sampling mode and the conversion mode during the first trim phase are explained now. It is understood, that a similar methodology is followed in each trim phase of the set of trim phases. In the sampling mode, the state logic circuit 122 generates the set of first control signals which couple bottom plates of the set of elementary capacitors 104 to the input voltage Vin 132. The trim logic circuit 124 generates the set of second control signals which couple bottom plates of the set of M offset capacitors 102 to the primary voltage Vp 142.

In the conversion mode, the ADC 100 generates a digital output corresponding to the input voltage Vin 132 and the primary voltage Vp 142 using a binary search technique. The binary search technique includes multiple cycles. In a cycle of multiple cycles, the state logic circuit 122 generates the set of first control signals to couple bottom plates of the set of elementary capacitors 104 to one of the positive reference voltage Vrefp 134 and the negative reference voltage Vrefm 136. The trim logic circuit 124 generates the set of second control signals which couple bottom plates of the set of M offset capacitors 102 to the primary voltage Vp 142.

A weighted voltage is generated at the inverting terminal 116 of the comparator 110. An estimated DAC (digital to analog converter) voltage is a weighted sum of the positive reference voltage Vrefp 134 and the negative reference voltage Vrefm 136 applied at the bottom plates of the set of elementary capacitors 104 and the primary voltage Vp 142 applied at the bottom plates of the set of M offset capacitors 102. Thus, the weighted voltage is an error or a difference between the input voltage Vin 132 and the estimated DAC voltage.

The comparator 110 compares the weighted voltage and the threshold voltage Vt 112 to generate a digital bit. The digital bit is provided to the state logic circuit. In each cycle of the binary search technique, the state logic circuit 122 generates the set of first control signals to couple a different number of capacitors in the set of elementary capacitors 104 to the positive reference voltage Vrefp 134 based on the digital bit.

The multiple cycles of the binary search technique further reduce the error in binary scaled steps. The digital bits generated after each cycle together forms the digital output. A 12 bit resolution ADC requires 12 successive cycles to resolve the input voltage Vin 132 to a 12 bit digital output.

The above description of the sampling mode and the conversion mode in the first trim phase is analogously applicable to each trim phase of the set of trim phases.

In the second trim phase, the set of M offset capacitors 102 are coupled to the primary voltage Vp 142 in the sampling mode and to the secondary voltage Vs 144 in the conversion mode. The ADC 100 generates a second digital code in the second trim phase. The trim logic circuit 124 generates the set of second control signals to activate the second set of switches 128 which couple bottom plates of the set of M offset capacitors 102 to the primary voltage Vp 142 in the sampling mode and to the secondary voltage Vs 144 in the conversion mode. The second trim phase occurs at the first temperature (T1).

After the second trim phase, the secondary voltage Vs 144 is modified such that the first digital code is equal to the second digital code. This ensures that the primary voltage Vp 142 is equal to the secondary voltage Vs 144 at the first temperature (T1). Thus, any offset added to the ADC 100 because of the set of M offset capacitors 102 is cancelled after the second trim phase.

In the third trim phase, the set of M offset capacitors 102 are coupled to the primary voltage Vp 142 both in the sampling mode and in the conversion mode. The ADC 100 generates a third digital code in the third trim phase. The trim logic circuit 124 generates the set of second control signals to activate the second set of switches 128 which couple bottom plates of the set of M offset capacitors 102 to the primary voltage Vp 142 both in the sampling mode and the conversion mode. The ADC 100 generates a third digital code in the third trim phase. The third trim phase occurs at the second temperature (T2).

A sign of the third digital code is used to determine a direction of the offset drift. If the third digital code is positive, the offset drift of the ADC 100 is positive, and if the third digital code is negative then the offset drift of the ADC 100 is negative. The fourth trim phase uses the sign of the third digital code to compensate offset drift with temperature of the ADC 100.

In the fourth trim phase, if the third digital code is positive, the set of M offset capacitors 102 are coupled to the secondary voltage Vs 144 in the sampling mode and to the primary voltage Vp 142 in the conversion mode. In the fourth trim phase, if the third digital code is negative, the set of M offset capacitors 102 are coupled to the primary voltage Vp 142 in the sampling mode and to the secondary voltage Vs 144 in the conversion mode. Thus, the primary voltage Vp 142 is used in one of the sampling mode and conversion mode based on the direction of the offset drift which may be positive or negative. The ADC 100 generates a fourth digital code in the fourth trim phase. The fourth trim phase occurs at the second temperature (T2).

After the fourth trim phase, N offset capacitors of the set of M offset capacitors are coupled to a ground terminal such that the fourth digital code is equal to a defined value. N is an integer. In one example, the defined value is 0. In another example, the defined value is fixed at the time of manufacturing a device with the ADC 100. Thus, the N offset capacitors coupled to the ground terminal are used to cancel the offset drift of the ADC 100. A slope of the offset drift is taken into consideration by changing a number of capacitors in the set of M offset capacitors.

An offset voltage provided by the set of M offset capacitors is defined as:

$$Voff = (sign) \times (Vp(T) - Vs(T)) \times \frac{(M-N)Coff}{Csamp} - Do \quad (1)$$

where, sign is the sign of the third digital code, Coff is a capacitance of each capacitor in the set of M offset capacitors 102, Csamp is a capacitance of the set of elementary capacitors 104, T is ambient temperature and Do is an offset at the first temperature T1. Thus, at the first temperature T1, any offset added to the ADC 100 because of the set of M offset capacitors 102 is cancelled by making the primary voltage Vp 142 equal to the secondary voltage Vs 144. Also, at temperature T2, the offset voltage (Voff) provided by the set of M offset capacitors is made equal to the offset associated with the ADC 100. Thus the offset voltage (Voff) linearly tracks the offset associated with the ADC 100 at all temperatures. Hence, this feature is used to cancel the offset drift with temperature of the ADC 100.

Thus, any offset drift with temperature of ADC 100 is compensated. This technique is also applicable to a switched capacitor circuit with any analog front end (AFE). The ADC 100 also overcomes the problem of dynamic offset storing. Also, the technique does not result in increase in white noise of an AFE of which the ADC 100 is a part.

FIG. 2 is a graph 200 to illustrate variation of voltages with temperature, according to an embodiment. The graph 200 is explained in connection with the primary voltage Vp 142 and the secondary voltage Vs 144 used in ADC 100 illustrated in FIG. 1. The primary voltage Vp 142 and the secondary voltage Vs 144 varies linearly with temperature. The primary voltage Vp 142 increases linearly with increase in temperature, and the secondary voltage Vs 144 decreases linearly with increase in temperature. In one example, a difference in the primary voltage Vp 142 and the secondary voltage Vs 144 varies linearly with temperature. In another example, one of the primary voltage Vp 142 and the secondary voltage Vs 144 varies linearly with temperature while the other one is constant with temperature. The property of linear dependence of the primary voltage Vp 142 and the secondary voltage Vs 144 on temperature is used for compensating offset drift with temperature of ADC 100. In one example, the property is used for compensating offset drift with temperature of an analog front end (AFE) of which ADC 100 is a part.

The ADC 100 operates in the set of trim phases. The first trim phase and the second trim phase occur at a first temperature (T1) 202, and the third trim phase and the fourth trim phase occur at a second temperature (T2) 204. After the second trim phase, the secondary voltage Vs 144 is modified such that the first digital code is equal to the second digital code. This ensures that the primary voltage Vp 142 is equal to the secondary voltage Vs 144 at the first temperature (T1) 202. After the fourth trim phase, N offset capacitors of the set of M offset capacitors are coupled to a ground terminal such that the fourth digital code is equal to a defined value. N is an integer. In one example, the defined value is 0.

FIG. 3 illustrates an analog front end (AFE) 300, according to an embodiment. The AFE includes a programmable gain amplifier (PGA) 302, a low pass filter (LPF) 304, an analog to digital converter (ADC) driver 306 and an ADC 308. The PGA 302 receives an input signal IN 301. The LPF 304 is coupled to the PGA 302. The ADC driver 306 is coupled to the LPF 304, and the ADC 308 is coupled to the ADC driver 306. The ADC 308 generates a digital output Dout 310.

The PGA 302 amplifies the input signal IN 301 to generate an amplified signal. The LPF 304 filters the amplified signal with a low frequency band to generate a filtered signal. The ADC driver 306 amplifies the filtered signal to generate a processed signal with a fixed center power at a fixed set point of the ADC 308. The ADC 308 generates the digital output Dout 310 from the processed signal. The ADC 308 is analogous to the ADC 100 in connection and operation.

The ADC 308 is used for compensating offset drift with temperature of the AFE 300. The offset drift compensation is applied on the ADC 308 which cancels the offset drift of the AFE 300. The ADC 308 includes a set of M offset capacitors similar to the ADC 100 which are used for compensating offset drift with temperature in the AFE 300. Since the ADC 308 is a last element in the AFE 300, it cancels the offset drift associated with other devices in the AFE 300.

FIG. 4 illustrates a primary voltage generation circuit 400. The primary voltage generation circuit 400, in one example, is used to generate the primary voltage Vp 142 illustrated in FIG. 1. The primary voltage generation circuit 400 includes a current mirror circuit 410 that receives a power supply VDD 408. The current mirror circuit 410 includes a first transistor N1 402 and a second transistor N2 404. In one version, when an area of the first transistor N1 402 is A, the area of the second transistor N2 404 is N*A, where N is a positive integer. Both the first transistor N1 402 and the second transistor N2 404 operate at a same current, and hence a first current I1 is generated across a first resistor R1 412. The current mirror circuit 410 mirrors the first current I1 across a second resistor R2 416. Thus, a primary current Ip flows through the second resistor R2 416. The primary current Ip is equal to the first current I1. A primary voltage Vp 420 is generated across the second resistor R2 416. The primary current Ip is defined as:

$$Ip = \frac{(Vbe1 - Vbe2)}{R1} = \frac{V_T ln\left(\frac{I1}{Is1}\right) - V_T ln\left(\frac{I1}{Is2}\right)}{R1} = \frac{V_T ln\left(\frac{Is2}{Is1}\right)}{R1} = \frac{V_T ln(N)}{R1} \quad (2)$$

where Vbe1 is a voltage across base-emitter terminals of the first transistor N1 402, Vbe2 is a voltage across base-emitter terminals of the second transistor N2 404, Is1 is saturation current in the first transistor N1 402, Is2 is saturation current in the second transistor N2 404.

The primary voltage Vp 420 is defined as:

$$Vp = Ip * R2 = V_T ln(N)\frac{R2}{R1} = \frac{KT}{q}ln(N)\frac{R2}{R1} = T * CONSTANT \quad (3)$$

Where, $V_T$=KT/q, K is the Boltzmann constant, T is the temperature in Kelvin and q is the charge of electron.

Thus, the primary voltage Vp 420 is directly proportional to the temperature (T). The primary voltage Vp 420 increases linearly with increase in temperature. The primary voltage Vp 420 is similar to the primary voltage Vp 142. It is understood that the primary voltage generation circuit 400 is one of one of the many ways of generating the primary voltage Vp and variations, and alternative constructions are apparent and well within the spirit and scope of the disclosure.

FIG. 5 illustrates a secondary voltage generation circuit 500. The secondary voltage generation circuit 500, in one example, is used to generate the secondary voltage Vs 144 illustrated in FIG. 1. The secondary voltage generation circuit 500 includes a current mirror circuit 510 that receives a power supply VDD 508. The current mirror circuit 510 includes a first transistor N1 502. A first current I1 flows through a first resistor R1 512. The current mirror circuit 510 mirrors the first current I1 across a second resistor R2 516. Thus, a secondary current Is flows through the second resistor R2 516. The secondary current Is is equal to the first current I1. A secondary voltage Vs 520 is generated across the second resistor R2 516. A voltage across base-emitter terminals of the first transistor N1 502 is defined as $$Vbe = V_T \ln\left(\frac{Ic}{Is}\right) \quad (4)$$

where, Ic is current through collector terminal of the first transistor N1 502 and Is is saturation current. The collector current variation with temperature is defined as:

$$Ic = DT^\alpha \quad (5)$$

where, D and α are constants. The saturation current variation with temperature is defined as:

$$Is = CT^\eta \exp\left(-\frac{qEg}{KT}\right) \quad (6)$$

where, Eg is bandgap, C, K, q and η are constants with respect to temperature variations. Replacing equation 5 and 6 in equation 4, the following equation is obtained:

$$Vbe = Eg + \frac{Vbe(To) - Eg}{To}T + (\alpha - \eta)\frac{kT}{q}\ln\left(\frac{T}{To}\right) \quad (7)$$

where, To is a defined temperature.

On differentiating equation 7, it is found that Vbe is inversely proportional to the temperature (T). The secondary voltage Vs 520 is defined as $$V_s = \frac{R4 * V_{be}}{R3} \quad (8)$$

Thus, the secondary voltage Vs 520 is proportional to Vbe. The secondary voltage Vs 520 is similar to Vbe and decreases linearly with increase in temperature. The secondary voltage Vs 520 is similar to the secondary voltage Vs 144. It is understood that the secondary voltage generation circuit 500 is one of one of the many ways of generating the secondary voltage Vs and variations, and alternative constructions are apparent and well within the spirit and scope of the disclosure.

FIG. 6 is a flowchart 600 illustrating a method of compensating offset drift, according to an embodiment. The flowchart 600 is explained in connection with the ADC 100 illustrated in FIG. 1. The ADC 100 is operated in a set of trim phases. Each trim phase includes a sampling mode and a conversion mode. Each trim phase includes the following steps. At step 602, an input voltage is provided to a set of elementary capacitors in the ADC in the sampling mode. A set of reference voltages is provided to the set of elementary capacitors in the ADC in the conversion mode, at step 604. The set of reference voltages includes a positive reference voltage and a negative reference voltage.

In ADC 100, the set of elementary capacitors 104 are coupled to the input voltage Vin 132 in the sampling mode. The state logic circuit 122 generates a set of first control signals to activate the first set of switches 126 which couple bottom plates of the set of elementary capacitors 104 to the input voltage Vin 132 in the sampling mode. Also, in each trim phase, the set of elementary capacitors 104 are coupled to one of the positive reference voltage Vrefp 134 and the negative reference voltage Vrefm 136 in the conversion mode. The state logic circuit 122 generates the set of first control signals to activate the first set of switches 126 which couple bottom plates of the set of elementary capacitors 104 to one of the positive reference voltage Vrefp 134 and the negative reference voltage Vrefm 136.

At step 606, one of a primary voltage and a secondary voltage are provided to a set of M offset capacitors in the SAR ADC. M is an integer. The primary voltage and the secondary voltage varies linearly with temperature. The primary voltage increases linearly with increase in temperature, and the secondary voltage decreases linearly with increase in temperature. In one example, a difference in the primary voltage and the secondary voltage varies linearly with temperature. The set of trim phases includes a first trim phase and a second trim phase occurring at a first temperature, and a third trim phase and a fourth trim phase occurring at a second temperature.

A first digital code is generated in the first trim phase. A second digital code is generated in the second trim phase. A third digital code is generated in the third trim phase and a fourth digital code is generated in the fourth trim phase. In the first trim phase, the set of M offset capacitors are coupled to the primary voltage both in the sampling mode and in the conversion mode. In the second trim phase, the set of M offset capacitors are coupled to the primary voltage in the sampling mode and to the secondary voltage in the conversion mode.

After the second trim phase, the secondary voltage provided to the set of M offset capacitors in the second trim phase is modified such that the first digital code is equal to the second digital code. This ensures that the primary voltage is equal to the secondary voltage at the first temperature. Thus, any offset added to the ADC 100 because of the set of M offset capacitors is cancelled after the second trim phase.

In the third trim phase, the set of M offset capacitors are coupled to the primary voltage both in the sampling mode and in the conversion mode. In the fourth trim phase, if the third digital code is positive, the set of M offset capacitors are coupled to the secondary voltage in the sampling mode and to the primary voltage in the conversion mode. In the fourth trim phase, if the third digital code is negative, the set of M offset capacitors are coupled to the primary voltage in the sampling mode and to the secondary voltage in the conversion mode.

After the fourth trim phase, N capacitors of the set of M capacitors are coupled to a ground terminal such that the fourth digital code is equal to a defined value, where N is an integer. In one example, the defined value is 0. Thus, the N offset capacitors coupled to the ground terminal are used to cancel the offset drift of the ADC 100. The fourth trim phase uses the sign of the third digital code to compensate offset drift with temperature of the ADC 100.

FIG. 7 illustrates a computing device 700, according to an embodiment. The computing device 700 is, or is incorporated into, a mobile communication device, such as a mobile phone, a personal digital assistant, a transceiver, a personal computer, or any other type of electronic system. The computing device 700 may include one or more additional components known to those skilled in the relevant art and are not discussed here for simplicity of the description.

In some embodiments, the computing device 700 comprises a megacell or a system-on-chip (SoC) which includes a processing unit 712 such as a CPU (Central Processing Unit), a memory module 714 (e.g., random access memory (RAM)) and a tester 710. The processing unit 712 can be, for example, a CISC-type (Complex Instruction Set Computer) CPU, RISC-type CPU (Reduced Instruction Set Computer), or a digital signal processor (DSP).

The memory module 714 (which can be memory such as RAM, flash memory, or disk storage) stores one or more software applications 730 (e.g., embedded applications) that, when executed by the processing unit 712, performs any suitable function associated with the computing device 700. The tester 710 comprises logic that supports testing and debugging of the computing device 700 executing the software applications 730.

For example, the tester 710 can be used to emulate a defective or unavailable component(s) of the computing device 700 to allow verification of how the component(s), were it actually present on the computing device 700, would perform in various situations (e.g., how the component(s) would interact with the software applications 730). In this way, the software applications 730 can be debugged in an environment which resembles post-production operation.

The processing unit 712 typically comprises memory and logic which store information frequently accessed from the memory module 714. The computing device 700 includes a logic unit 720. The logic unit 720 is coupled to the processing unit 712 and the memory module 714. The logic unit 720 includes an analog to digital converter (ADC) 718. The ADC 718 is similar in connection and operation to the ADC 100. The ADC 718 includes a set of M offset capacitors. The set of M offset capacitors receive a primary voltage and a secondary voltage.

The primary voltage and the secondary voltage varies linearly with temperature. The primary voltage increases linearly with increase in temperature, and the secondary voltage decreases linearly with increase in temperature. In one example, a difference in the primary voltage and the secondary voltage varies linearly with temperature. The property of linear dependence of the primary voltage and the secondary voltage on temperature is used for compensating offset drift with temperature of ADC 718. In one example, the property is used for compensating offset drift with temperature of an analog front end (AFE) of which ADC 718 is a part.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An analog to digital converter (ADC) comprising:
   a comparator configured to receive a threshold voltage;
   a set of elementary capacitors coupled to the comparator, and configured to receive one of an input voltage and a set of reference voltages; and
   a set of M offset capacitors coupled to the comparator, and configured to receive one of a primary voltage and a secondary voltage, M is an integer, wherein a difference in the primary voltage and the secondary voltage varies linearly with temperature.

2. The ADC of claim 1, wherein the set of reference voltages includes a positive reference voltage and a negative reference voltage.

3. The ADC of claim 1, wherein the primary voltage increases linearly with increase in temperature, and the secondary voltage decreases linearly with increase in temperature.

4. The ADC of claim 1, wherein the comparator comprises:
   a non-inverting terminal configured to receive the threshold voltage; and
   an inverting terminal coupled to the set of elementary capacitors and the set of M offset capacitors.

5. The ADC of claim 1 is configured to operate in a set of trim phases and each trim phase of the set of trim phases comprises a sampling mode and a conversion mode, the set of trim phases comprises:
   a first trim phase, the ADC is configured to generate a first digital code in the first trim phase;
   a second trim phase, the ADC is configured to generate a second digital code in the second trim phase;
   a third trim phase, the ADC is configured to generate a third digital code in the third trim phase; and
   a fourth trim phase, the ADC is configured to generate a fourth digital code in the fourth trim phase.

6. The ADC of claim 4, wherein the first trim phase and the second trim phase occur at a first temperature, and the third trim phase and the fourth trim phase occur at a second temperature.

7. The ADC of claim 5, wherein in each trim phase of the set of trim phases:
   the set of elementary capacitors are coupled to the input voltage in the sampling mode; and
   the set of elementary capacitors are coupled to one of the positive reference voltage and the negative reference voltage in the conversion mode.

8. The ADC of claim 5, wherein in the first trim phase the set of M offset capacitors is coupled to the primary voltage both in the sampling mode and in the conversion mode.

9. The ADC of claim 5, wherein in the second trim phase the set of M offset capacitors are coupled to the primary voltage in the sampling mode and to the secondary voltage in the conversion mode.

10. The ADC of claim 9, wherein after the second trim phase, the secondary voltage provided to the set of M offset capacitors is modified such that the first digital code is equal to the second digital code.

11. The ADC of claim 5, wherein in the third trim phase the set of M offset capacitors are coupled to the primary voltage both in the sampling mode and in the conversion mode.

12. The ADC of claim 5, wherein in the fourth trim phase, if the third digital code is positive, the set of M offset capacitors are coupled to the secondary voltage in the sampling mode and to the primary voltage in the conversion mode, and if the third digital code is negative, the set of M offset capacitors are coupled to the primary voltage in the sampling mode and to the secondary voltage in the conversion mode.

13. The ADC of claim 12, wherein after the fourth trim phase, N offset capacitors of the set of M offset capacitors are coupled to a ground terminal such that the fourth digital code is equal to a defined value, where N is an integer.

14. A method of compensating offset drift comprising:
   operating an analog to digital converter (ADC) in a set of trim phases, each trim phase of the set of trim phases comprising a sampling mode and a conversion mode, and each trim phase further comprising:
   providing an input voltage to a set of elementary capacitors in the ADC in the sampling mode;
   providing a set of reference voltages to the set of elementary capacitors in the ADC in the conversion mode; and providing one of a primary voltage and a secondary voltage to a set of M offset capacitors in the ADC, M is an integer, wherein a difference in the primary voltage and the secondary voltage varies linearly with temperature.

15. The method of claim 14, wherein:
the set of reference voltages includes a positive reference voltage and a negative reference voltage; and
the primary voltage increases linearly with increase in temperature, and the secondary voltage decreases linearly with increase in temperature.

16. The method of claim 14, wherein the set of trim phases further comprises a first trim phase and a second trim phase occurring at a first temperature, and a third trim phase and a fourth trim phase occurring at a second temperature.

17. The method of claim 16 further comprising:
generating a first digital code in the first trim phase;
generating a second digital code in the second trim phase;
generating a third digital code in the third trim phase; and
generating a fourth digital code in the fourth trim phase.

18. The method of claim 17 further comprising:
coupling the set of M offset capacitors to the primary voltage both in the sampling mode and in the conversion mode, in the first trim phase;
coupling the set of M offset capacitors to the primary voltage in the sampling mode and to the secondary voltage in the conversion mode, in the second trim phase; and
modifying the secondary voltage provided to the set of M offset capacitors in the second trim phase such that the first digital code is equal to the second digital code.

19. The method of claim 17 further comprising:
coupling the set of M offset capacitors to the primary voltage both in the sampling mode and in the conversion mode, in the third trim phase;
coupling the set of M offset capacitors to the secondary voltage in the sampling mode and to the primary voltage in the conversion mode, in the fourth trim phase if the third digital code is positive;
coupling the set of M offset capacitors to the primary voltage in the sampling mode and to the secondary voltage in the conversion mode, in the fourth trim phase if the third digital code is negative; and
coupling N capacitors of the set of M capacitors to a ground terminal such that the fourth digital code is equal to a defined value, where N is an integer.

20. A computing device comprising:
a processing unit;
a memory module coupled to the processing unit; and
a logic unit coupled to the processing unit and the memory module, the logic unit comprising an analog to digital converter (ADC), the ADC comprising:
a comparator configured to receive a threshold voltage;
a set of elementary capacitors coupled to the comparator, and configured to receive one of an input voltage and a set of reference voltages; and
a set of M offset capacitors coupled to the comparator, and configured to receive one of a primary voltage and a secondary voltage, M is an integer, wherein a difference in the primary voltage and the secondary voltage varies linearly with temperature.

* * * * *